United States Patent
Tomioka et al.

[11] Patent Number: 6,007,625
[45] Date of Patent: Dec. 28, 1999

[54] APPARATUS FOR MANUFACTURING SINGLE CRYSTAL

[75] Inventors: Junsuke Tomioka; Hiroshi Inagaki; Fumitaka Ishikawa, all of Kanagawa, Japan

[73] Assignee: Komatsu Electronic Metals Co., Ltd., Kanagawa, Japan

[21] Appl. No.: 08/941,309

[22] Filed: Sep. 30, 1997

[30] Foreign Application Priority Data

Oct. 1, 1996 [JP] Japan ................................ 8-280152

[51] Int. Cl.$^6$ ................................................. C30B 35/00
[52] U.S. Cl. ........................ 117/217; 117/218; 117/222; 117/917
[58] Field of Search .................. 117/19, 208, 217, 117/218, 222, 917

[56] References Cited

U.S. PATENT DOCUMENTS

| | | |
|---|---|---|
| 5,571,320 | 11/1996 | Grimes et al. . |
| 5,578,123 | 11/1996 | Viltzmann et al. ............... 117/222 |
| 5,707,447 | 1/1998 | Schulmann et al. ............... 117/222 |
| 5,720,810 | 2/1998 | Arai et al. .......................... 117/217 |
| 5,824,152 | 10/1998 | Kubota et al. ...................... 117/217 |
| 5,853,480 | 12/1998 | Kubota et al. ...................... 117/217 |
| 5,858,085 | 1/1999 | Arai et al. .......................... 117/217 |

FOREIGN PATENT DOCUMENTS 403050179  3/1991  Japan ..................................... 117/917

*Primary Examiner*—Felisa Hiteshew
*Attorney, Agent, or Firm*—Sughrue, Mion, Zinn, Macpeak & Seas, PLLC

[57] ABSTRACT

This invention provides a method and a apparatus capable of manufacturing single crystals with an oxygen density of less than $12\times10^{17}$ atoms/cm$^3$ or less than $10\times10^{17}$ atoms/cm$^3$, and wherein the oxygen density of the single crystal produced is uniformly distributed along its longitudinal axis. The electrical power inputted into the main heater 6 surrounding the quartz crucible 4 and the top heater 9 shaped like a reverse frustrated cone and disposed above the quartz crucible 4, is controlled to keep the temperature of the melt 5 in a preset range during the process of pulling up the single crystal silicon 10. When combining the main heater 6 and the top heater 9, the heat emitted from the main heater 6 can be kept small, and the heat load on the quartz crucible 4 and the amount of oxygen released from the quartz crucible 4 and dissloved into melt 5 can be reduced. Therefore, a single crystal of low oxygen density and with uniformly distributed oxygen density along its longitudinal axis can be obtained. Furthermore, the single-crystal silicon 10 can be assigned a proper thermal history. In the above process, if a magnetic field is applied to the melt, then single crystals of much lower oxygen density can be obtained.

5 Claims, 7 Drawing Sheets

APPARATUS FOR MANUFACTURING SINGLE CRYSTAL

BACKGROUND OF THE INVENTION

1. Field of the Invention

The present invention relates to a method for manufacturing single crystals by the Czochralski Method (CZ method), particularly to a method and a apparatus for manufacturing single crystals which can reduce the oxygen density along longitudinal axes of produced single crystals.

2. Description of the Prior Art

Single crystals are conventionally produced by the CZ method. In the CZ method, polycrystalline silicon lumps are fed into a quartz crucible of a single crystal manufacturing apparatus, then the quartz crucible is heated by heaters disposed therearound to melt the polycrystalline silicon lumps, thereafter a seed crystal installed on a seed chuck is dipped into the melt. After that, the seed chuck and the quartz crucible are respectively driven to rotate in opposite or identical directions, and at the same time the seed chuck is pulled up to grow a single-crystal silicon ingot of predetermined diameter and length.

Due to the fact that the inner surface of the crucible is in contact with the melt, oxygen contained in the inner surface of the crucible dissolves into the melt. Most of the oxygen evaporates through the surface of the melt and is expelled out of the single crystal manufacturing apparatus, however, the remaining oxygen enters the single crystal being pulled up. The density of oxygen in single crystals is high at the beginning of the pulling up operation and declines following an increase of the solidification ratio. The oxygen entering the single crystal plays the role of cleaning up contamination by a very small amount of heavy metal during the manufacturing process of semiconductor devices, in other words, if exhibits an intrinsic-gettering effect. However, when oxygen remains in the active layers of wafer surfaces, it becomes nuclei of oxidation-induced stacking faults and thus negatively affects the electric characteristics of semiconductor devices.

To equalize oxygen density along the longitudinal axis of a single-crystal ingot, various proposals are recommended. For example, a method for manufacturing single crystals is disclosed in the Japanese publication gazette TOKU KAIHEI 2-192486, in which the output of heaters disposed around the body and the bottom of a quartz crucible is controlled. Also, a method for manufacturing single crystals is disclosed in TOKU KAIHEI 2-217388, in which a quartz crucible is provided with heat shield members used for covering all of the quartz crucible except for the single-crystal silicon pulling up zone, during the operation of pulling up single-crystal silicon by the CZ method, and the output of heaters disposed around the body and the bottom of the quartz crucible are controlled. Furthermore, in TOKU KAIHEI 2-229786, a horizontal magnetic field is applied to the melt in a quartz crucible and the output of heaters disposed around the body and the bottom of the quartz crucible is controlled.

Also, in TOKU KAI HEI 5-294782, the oxygen density of single-crystal silicon is reduced by controlling the melt temperature via a main heater and a multiple staged subheater disposed above the melt and shaped in concentric circles.

However, in recent years, as the volume of quartz crucibles rises following the enlargement of the sizes of single crystal silicon ingots, both an electric amount of power required by heaters and surface of quartz crucibles in contact with melt are increased, and then the amount of oxygen coming from quartz crucibles and dissolved in melt has also increased. Hence, it is difficult to obtain low oxygen single crystals with oxygen density of less than $12 \times 10^{17}$ atoms/cm$^3$ or extreme low oxygen single crystals with oxygen density of less than $10 \times 10^{17}$ atoms/cm$^3$ by using above conventional methods. In addition, it takes a long time to grow large single-crystal silicon, therefore there exists a danger of worsening quality of quartz crucibles by heat load and polycrystallizing single crystals during the pulling up operation. In view of the above situation, it is difficult to impose minimum heat load on quartz crucibles during pulling up operation as conventionally. Furthermore, in TOKU KAI HEI 6-183876, the inventors of this invention disclosed a method and an apparatus suitable for recharging material when single-crystal silicon has been pulled up, or for applying a supplementary charge of material when a preset amount of material has been melted and additional material is required to increase the amount of melt.

SUMMARY OF THE INVENTION

In view of the above described defects, the object of the present invention is to provide a method and an apparatus capable of manufacturing a single-crystal silicon of large diameter, the oxygen density of which is uniformly distributed along its longitudinal axis and has a value of less than $12 \times 10^{17}$ atoms/cm$^3$ or less than $10 \times 10^{17}$ atoms/cm$^3$.

To achieve the above object, according to this invention, an apparatus for manufacturing single-crystal silicon by the CZ method is characterized in that a top heater is disposed above the quartz crucible and the top heater is provided with at least one of the following functions:

(1) rectifying carrier gases;
(2) heating the raw material and a melt of the raw material fed into the quartz crucible;
(3) heating the single crystal silicon being pulled up;
(4) depressing the amount of oxygen dissolved into the melt from the quartz crucible and the deterioration of the quartz crucible induced by heat load; and
(5) giving thermal history to the single-crystal silicon pulled up from the melt.

According to the above structure, a top heater combined with a rectifying cylinder for the purpose of rectifying carrier gases is disposed above the quartz crucible, therefore the amount of heat emitted from the main heater can be minimized if the top heater and the main heater are used simultaneously. As a result, the heat load on the quartz crucible and the amount of oxygen dissolved into the melt from the quartz crucible can be reduced. Furthermore, the single-crystal silicon is heated by the top heater when passing a preset temperature zone, thus slip back can be prevented and a preset thermal history can be given to the single-crystal silicon.

The top heater in the apparatus for manufacturing single crystal silicon according to this invention is a reverse-frustrated cone opened at its two ends or a heater provided with one- or multiple-stage cylinders.

By this arrangement, the single-crystal silicon can be heated to a predetermined temperature when passing through the top heater and thus can be given a proper thermal history. When a multiple-stage heater is used, the heated status can be far more precisely controlled rather than with a one stage heater.

Furthermore, in the top heater according to this invention, at least the surface facing the melt is covered by reflection plates.

By using the reflection plates, radiation heat coming from the main heater, the quartz crucible, and the melt is reflected back on the melt, therefore electrical power required by the main heater can be further reduced.

Furthermore, in the apparatus for manufacturing single crystal silicon according to this invention, the top heater is disposed adjacent to the lower end of the cylindrical or reverse-frustrated cone-shaped rectifying cylinder By this arrangement, the top heater is disposed near the melt surface, to facilitate the heating of melt or polycrystalline silicon lumps and keep warm the single crystal silicon being pulled up.

In the apparatus for manufacturing single-crystal silicon according to this invention, means for applying a magnetic field is provided.

By applying a horizontal magnetic field or cusp magnetic field to the quartz crucible and melt, convection of melt can be prevented. Thus, the amount of oxygen dissolved in the melt is reduced and the oxygen density in the single crystal silicones also decreases.

The method for manufacturing single-crystal silicon according to this invention is characterized in that the electrical power inputted into the main heater surrounding the quartz crucible and the top heater disposed above the quartz crucible is controlled to keep the temperature of melt within a predetermined range when pulling up the single-crystal silicon.

According to the above structure, the melt is heated by the top heater, even if the output of the main heater is reduced, the temperature of melt can also be kept within a predetermined range. Therefore, the heat load on the quartz crucible decreases, deterioration of the quartz crucible can be prevented, and the ratio of single crystallization can be enhanced. Furthermore, the single-crystal silicon pulled up from melt is heated by the top heater, the cooling temperature gradient is small, especially, when passing through the temperature zone of from 1150° C. to 1080° C., thus, the number of small crystal defects can thus be reduced.

Also, the method for manufacturing single-crystal silicon according to this invention is characterized in that a magnetic field is applied to the melt and the electrical power inputted into the main heater surrounding the quartz crucible and the top heater disposed above the quartz crucible is controlled when pulling up the single-crystal silicon.

By this arrangement, melt is heated by the main heater and the top heater, the heat load on the quartz crucible is reduced from that when only using a main heater or using a main heater and a bottom heater in combination, and the amount of oxygen in the melt also decreases. In addition, a horizontal magnetic field or a cusp magnetic field is applied to the melt, thus convection along the internal surface of the quartz crucible is prevented and the amount of oxygen dissolved in the melt is further reduced. Therefore, single-crystal silicon with an exceptionally low oxygen density can be obtained.

In addition, the method for manufacturing single-crystal silicon according to this invention is characterized in that the electrical power inputted into the main heater surrounding the quartz crucible and the top heater disposed above the quartz crucible is controlled to melt polycrystalline silicon lumps, and a predetermined amount of supplementary melt is fed thereinto.

If the top heater is used, the recharge material or supplementary charge can be melted easily. Furthermore, the output of the main heater can be reduced, thus heat load of the quartz crucible decreases and deterioration of the quartz crucible can be prevented. Consequently, in the operation of pulling up the single-crystal silicon, even if the same quartz crucible is repeatedly used for several times the ratio of single crystallization will not decline.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENTS

Figure 1:
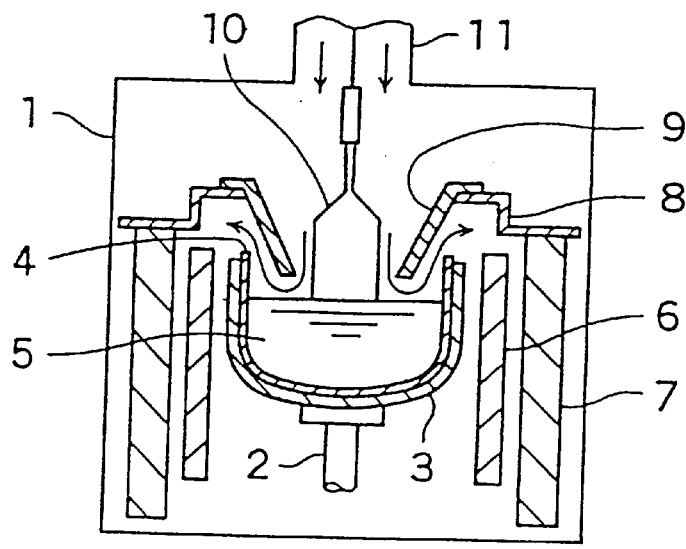
FIG. 1 is a schematic vertical cross-sectional view of the first embodiment of the apparatus for manufacturing single-crystal silicon according to this invention.

Next, embodiments of the method and the apparatus for manufacturing single-crystal silicon according to this invention will be explained with reference to drawings. FIG. 1 is a schematic vertical cross-sectional view of the first embodiment of the apparatus for manufacturing single-crystal silicon according to this invention. As shown in FIG. 1, a graphite crucible 3 is installed on the top of a crucible axis 2 which is accommodated within the main chamber 1 in a manner capable of rotating, ascending and descending. The graphite crucible 3 accommodates a quartz crucible 4 in which melt 5 of polycrystalline silicon is stored. A cylindrical main heater 6 and a cylindrical adiabatic cylinder 7 are disposed around the graphite crucible 3. A support member 8 is installed on the top of the adiabatic cylinder 7 and a top heater 9 is fixed on the support member 8.

The pulled up single-crystal silicon 10 is pulled up into a pull chamber 11 by way of the openings of the two end portions of the top heater 9. As shown in FIG. 1, Argon used as a carrier gas, which is introduced from the upper portion of the pull chamber 11, flows in the direction of arrows, and passes through the surroundings of the single-crystal silicon 10 being pulled up, then the carrier gas passes through the clearance between the top heater 9 and the single-crystal silicon 10. After passing through the clearance between the lower end of the top heater 9 and melt 5, the carrier gas is expelled, together with $SiO_x$ evaporated from melt 5, to the outside through the bottom of the main chamber 1.

Figure 2:
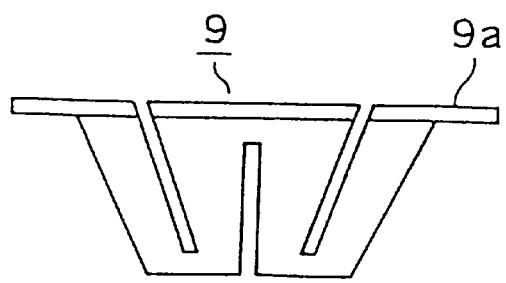
FIG. 2 is a side view showing the shape and structure of a first example of the top heat.
Figure 3:
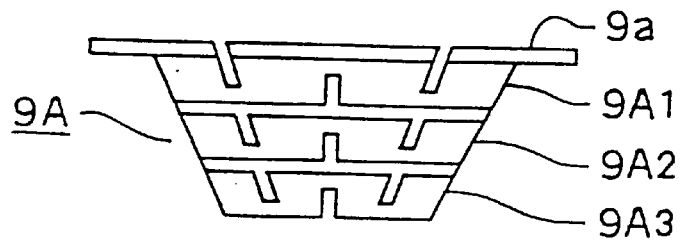
FIG. 3 is a side view showing the shape and structure of a second example of the top heat.
Figure 4:
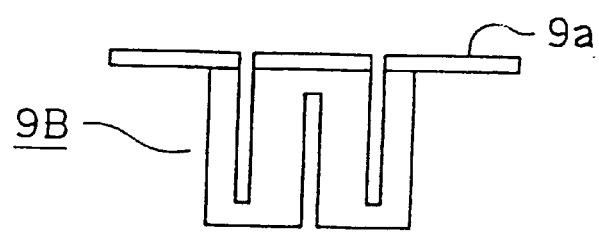
FIG. 4 is a side view showing the shape and structure of a third example of the top heat.
Figure 5:
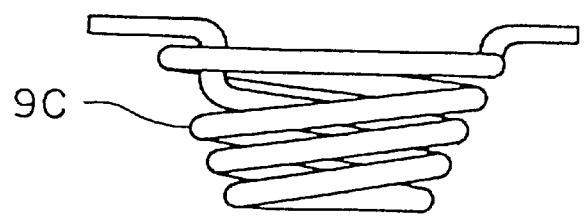
FIG. 5 is a side view showing the shape and structure of a fourth example of the top heat.
Figure 6:
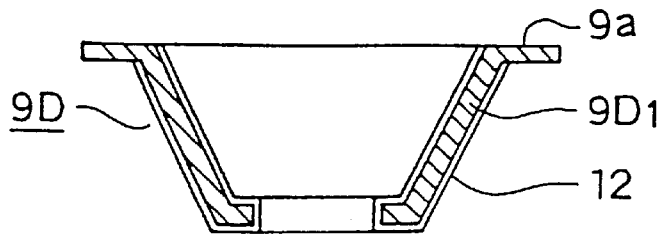
FIG. 6 is a vertical cross-sectional view showing the shape and structure of a fifth example of the top heat.

FIGS. 2 to 7 are illustrations showing the shape and the structure of various top heaters. The top heater 9 shown in FIG. 2 is a one-stage type, it is shaped like a frustrated cone with two open ends. The top heater 9 is made of carbon CIP, and its upper end is provided with a flange 9a on which the support member 8 of FIG. 1 is hooked. The top heater 9A shown in FIG. 3 is a multiple-stages type, which is made of carbon CIP and consists of three piled stages of frustrated top heaters 9A1, 9A2 and 9A3. The top heater 9B shown in FIG. 4 is made of carbon CIP and shaped like a hollow cylinder. The top heater 9C shown in FIG. 5 is formed by winding a graphite cord into a coil having a frustrated cone shape and coating the cone with SiC. In the above example, the graphite cord can also be wound into a hollow cylinder. The top heater 9D shown in FIG. 6 is a frustrated cone having two open ends, a reflection plate 12 covers the surface of a heater 9D1 which is made of graphite. The reflection plate 12 is made of carbon CIP, or heat-resisting metals such as molybdenum, tungsten and so on.

Figure 7A:
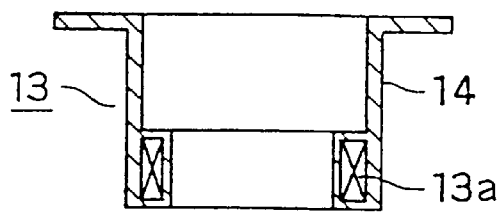
FIG. 7a–7c are vertical cross-sectional veiws showing the shape and structure of a sixth example of the top heat, wherein (a) shows a heater disposed on the internal peripheral surface of the lower end portion of the rectifying cylinder, (b) shows a heater disposed on the outer peripheral surface of the lower end portion of the rectifying cylinder, (c) shows two heaters disposed respectively on the outer peripheral surface and the internal peripheral surface of the lower end portion of the rectifying cylinder.
Figure 7B:
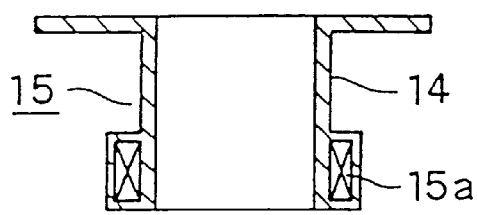
Figure 7C:
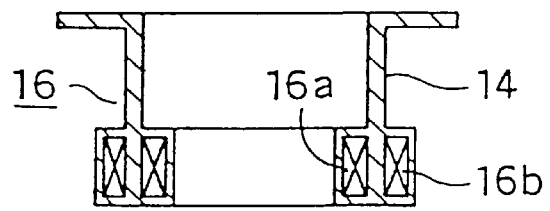

FIG. 7 shows a rectifying cylinder made of SiC the lower end of which is provided with a graphite heater coated with SiC, z wherein (a) shows a top heater 13 having a cylindrical heater 13a disposed on the internal peripheral surface of the lower end portion of the rectifying cylinder 14, (b) shows a top heater 15 having a cylindrical heater 15a disposed on the outer peripheral surface of the lower end portion of the rectifying cylinder 14, (c) shows a top heater 16 having two cylindrical heaters 16a, 16b respectively disposed on the outer peripheral surface and the internal peripheral surface of the lower end portion of the rectifying cylinder 14.

FIG. 1 shows an apparatus for manufacturing single-crystal silicon, wherein polycrystalline silicon of 120kg weight was fed into a 24-inch quartz crucible to pull up an 8-inch single-crystal silicon. In FIG. 1, a top heater as shown in FIG. 2 was used, and it was arranged that an electrical power of 100 KW is inputted into the main heater and an electrical power of 15 KW is inputted into the top heater. For comparison, in conventional cases such as the manufacturing process disclosed in the Japanese publication gazette TOKU KAI HEI 2-217388, an electrical power of 100 KW was inputted into the main heater and an electrical power of 20 KW was inputted into the bottom heater, and polycrystalline silicon of 120 kg weight was fed into a 24-inch quartz crucible to pull up an 8-inch single-crystal silicon.

Figure 8:
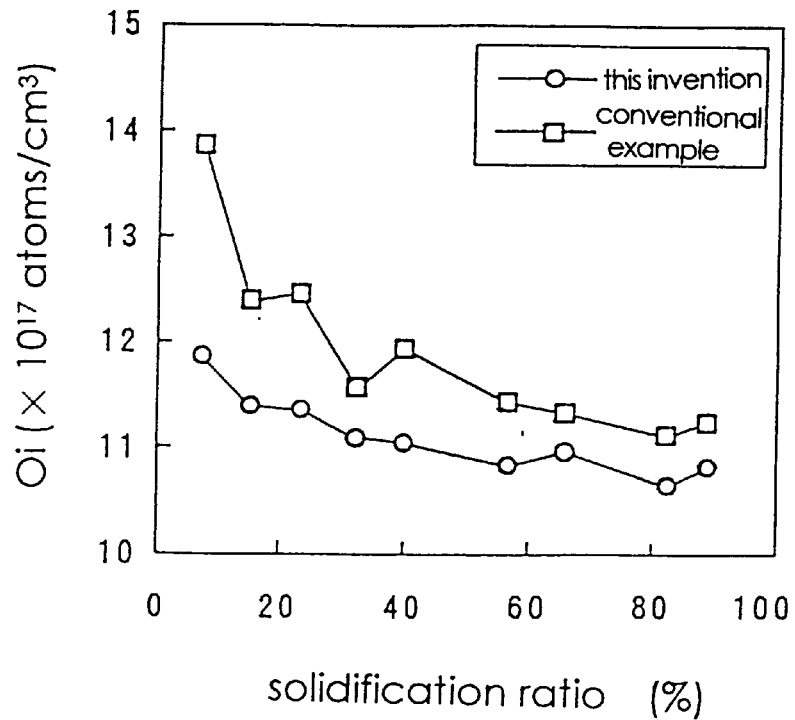
FIG. 8 is a chart showing the profile of oxygen density along the longitudinal axis of the single-crystal silicon.

FIG. 8 is a chart showing the profile of oxygen density along the longitudinal axis of single-crystal silicon produced under the above described conditions. In conventional cases, in the zones with low solidification ratios such as the portions near the shoulder of single crystal ingots, oxygen density was high and decreased following an increase of the solidification ratio. However, using the manufacturing process of this invention, a low oxygen single-crystal ingot with oxygen density of less than $12 \times 10^{17}$ atoms/cm$^3$ through the whole ingot was obtained, and the distribution of oxygen density along the longitudinal axis of the single-crystal ingot also became substantially uniform. The reasons for the above outcome are that the operation of the top heater reduced the output of the main heater and no bottom heater was used. As a result, the heat load on the quartz crucible was reduced and the amount of oxygen dissolved in the melt dropped.

Figure 9:
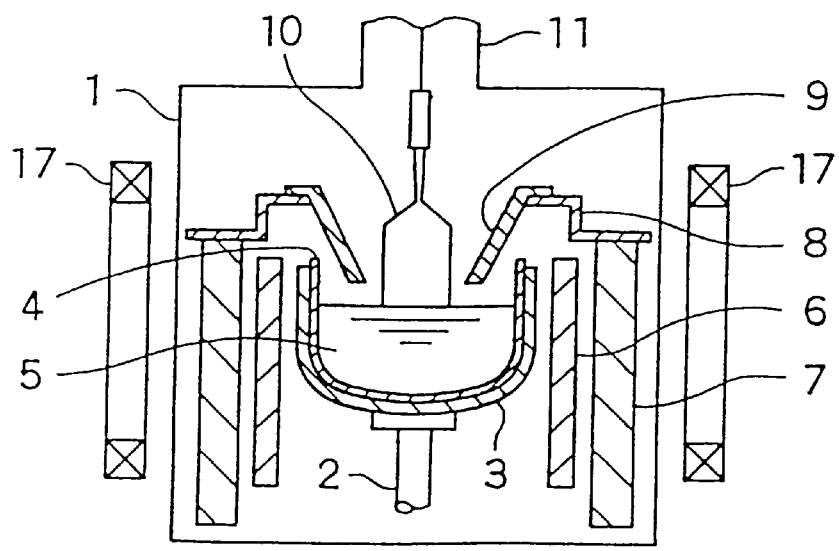
FIG. 9 is a schematic vertical cross-sectional view of the second embodiment of the apparatus for manufacturing single crystal silicon according to this invention.

FIG. 9 is a schematic vertical cross-sectional view of the second embodiment of the apparatus for manufacturing single-crystal silicon according to this invention. In this single-crystal silicon manufacturing apparatus, two coils 17, 17 are provided around the main chamber 1, the two coils 17, 17 are disposed vertically in such a manner that they sandwich the main chamber 1 so as to apply a horizontal magnetic field to the melt 5. Other structures of FIG. 9 are the same as those shown in the first embodiment, therefore same numerals attached to same structural members and explanation are omitted.

Figure 10:
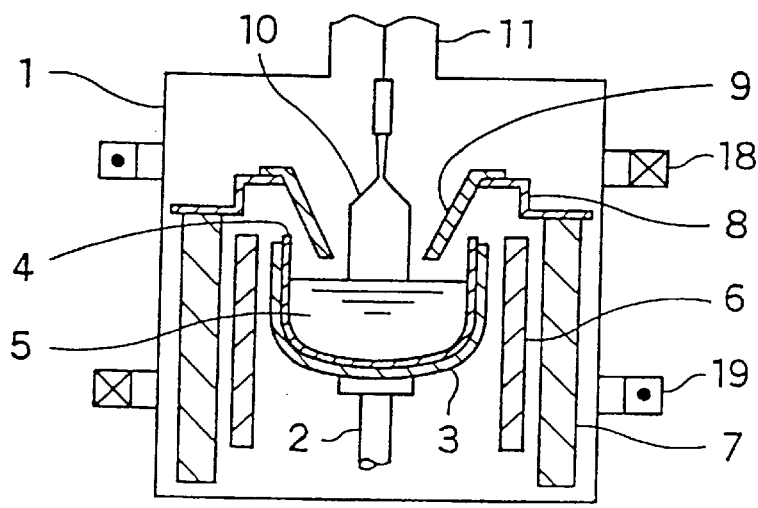
FIG. 10 is a schematic vertical cross-sectional view of the third embodiment of the apparatus for manufacturing single-crystal silicon according to this invention.

FIG. 10 is a schematic vertical cross-sectional view of the third embodiment of the apparatus for manufacturing single-crystal silicon according to this invention. In this single-crystal silicon manufacturing apparatus, a ring-shaped upper coil 18 and a ring-shaped lower coil 19 are provided around the main chamber 1 so as to apply a cusp magnetic field to the melt 5. Other structures of FIG. 10 are the same as those shown in the first embodiment, therefore the same numerals and labels attached to the same structural members are omitted.

Figure 11:
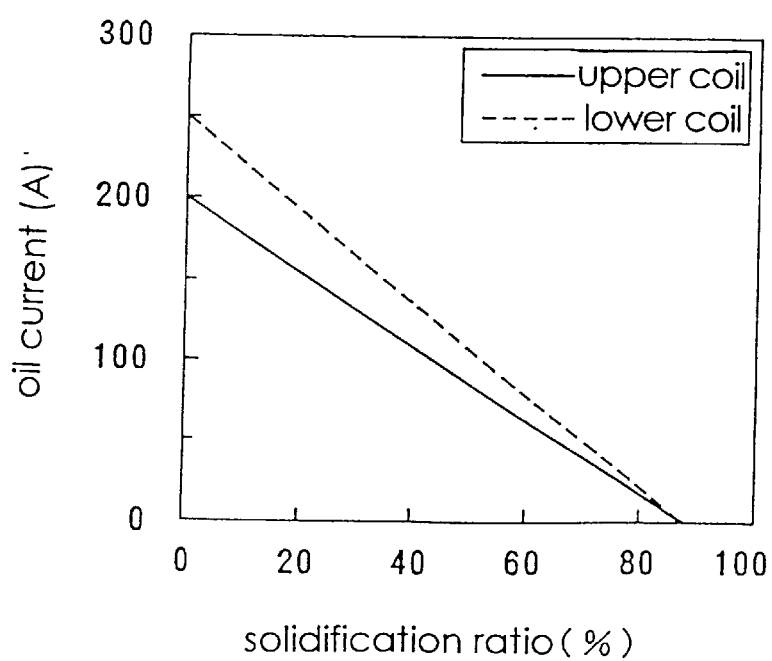
FIG. 11 is a diagram showing the controlled circumstances of electric current inputted into the coil to generate a cusp magnetic field.

In the single-crystal silicon manufacturing apparatus s of the second and third embodiments shown respectively in FIGS. 9 and 10, polycrystalline silicon of 120 kg weight was fed into a 24-inch quartz crucible to pull up an 8-inch single crystal silicon. The top heater shown in FIG. 2 was used, and an electrical power of 100 KW was inputted into the main heater and an electrical power of 15 KW was inputted into the top heater. In the second embodiment, the strength of the horizontal magnetic field was maintained at 4000 gauss, and in the third embodiment, the electric current inputted into the coils was controlled based on the graph shown in FIG. 11 to match the rise of the solidification ratio.

For comparison, in conventional cases such as the manufacturing process disclosed in the Japanese publication gazette TOKU KAI HEI 2-229786, an electrical power of 100 KW was inputted into the main heater, an electrical power of 20 KW was inputted into the bottom heater, a horizontal magnetic field of 4000 gauss in strength was applied, and polycrystalline silicon of 120 kg weight was fed into a 24-inch quartz crucible to pull up an 8-inch single-crystal silicon.

Figure 12:
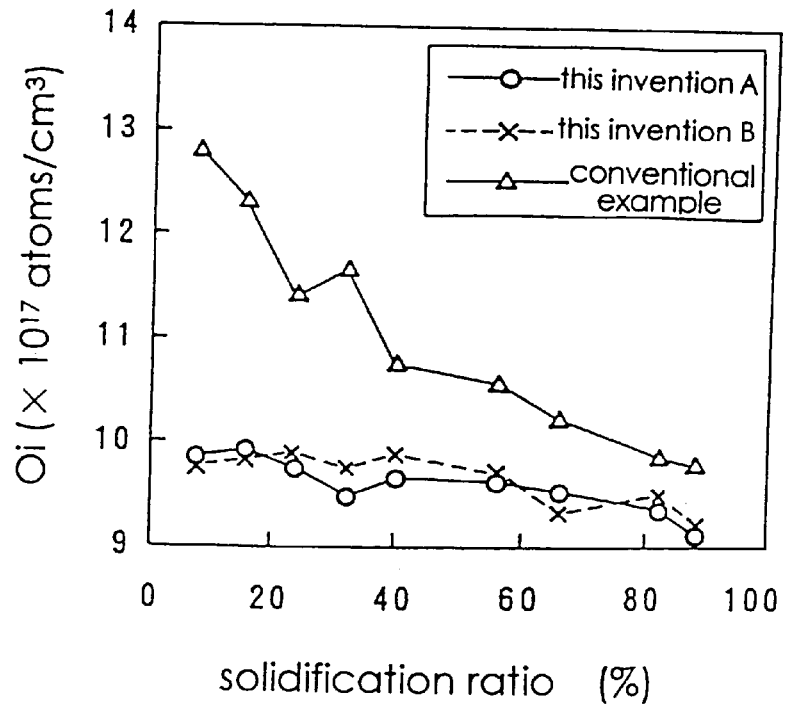
FIG. 12 is a chart showing the profile of oxygen density along the longitudinal axis of the single-crystal silicon when a magnetic field is applied thereon.

FIG. 12 is a chart showing the profile of oxygen density along the longitudinal axis of single-crystal silicon produced under above described conditions. In FIG. 12, this invention A denotes the result of the second embodiment and this invention B denotes the result of the third embodiment. When using the conventional art, in the zones with low solidification ratios such as the portions near the shoulder of single-crystal ingots, the oxygen density was high and decreased following an increase of the solidification ratio. However, using the manufacturing process of this invention, an extremely low-oxygen single-crystal ingot with an oxygen density of less than $10 \times 10^{17}$ atoms/cm$^3$ through out the whole ingot was obtained, and the distribution of oxygen density along the longitudinal axis of the single-crystal ingot also became substantially uniform.

The fourth embodiment of single-crystal silicon manufacturing methods according to this invention is related to not only melting the first stage material fed into the quartz crucible but also an improvement to the recharging operation when polycrystalline silicon lumps must be fed and melted within the quartz crucible in addition to a preset amount of remaining melt of the first stage material, or applying a supplementary charging operation when the first stage material has been melted and additional material is required to increase the amount of melt.

Figure 13:
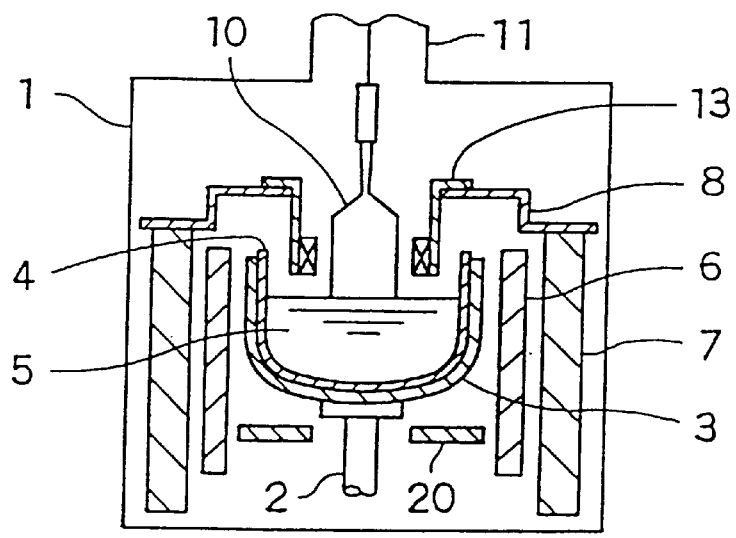
FIG. 13 is a schematic vertical cross-sectional view of the fourth embodiment of experimental apparatus for manufacturing single-crystal silicon according to the method of this invention.

In the experiments concerning melting of the first stage material, the experimental apparatus shown in FIG. 13 was used and polycrystalline silicon of 210 kg weight was fed into a 28-inch quartz crucible to pull up a 12-inch single crystal silicon. On that occasion, a main heater 6 and a top heater as shown in FIG. 7(a) were used. For comparison, two conventional cases, in other words, cases where only the main heater 6 and the main heater 6 combined with the bottom heater 20, were utilized to pull up single-crystal silicon. The amount of electrical power inputted into each heater is shown in Table one.

TABLE ONE

| | Electrical power inputted into the heaters (KW) | | | | |
|---|---|---|---|---|---|
| | A The invention | | B Conventional case-1 | C Conventional case-2 | |
| Process | Main heater | Top heater | Main heater only | Main heater | Bottom heater |
| Melting material | 170 | 45 | 210 | 170 | 45 |
| Forming the body of the ingot | 110 | 25 | 150 | 110 | 35 |

Figure 14:
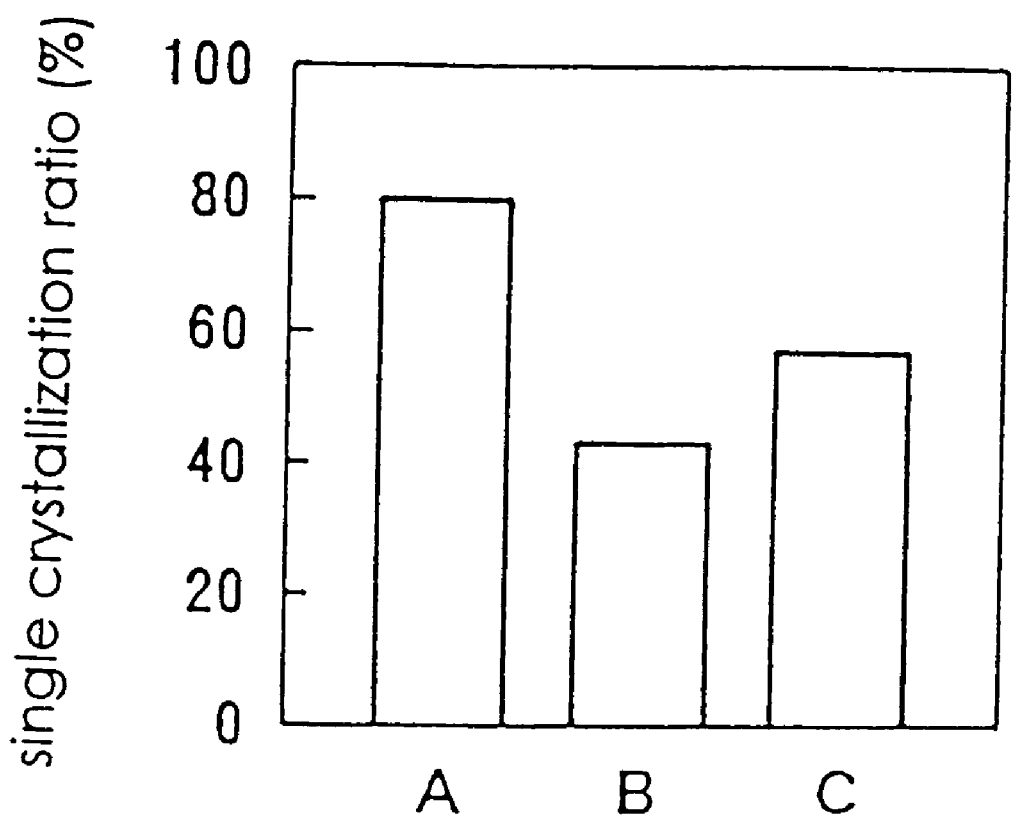
FIG. 14 is a diagram showing a comparison of the ratios of single crystallization from the varions cases.

The ratios of single crystallization obtained from the above experiments are shown in FIG. 14, wherein A denotes the single crystallization ratio obtained by the manufacturing process of this invention, B and C denote the single crystallization ratios obtained by conventional case-1 (only the main heater 6 was used), and conventional case-2 (the main heater 6 and the bottom heater 20 were used), respectively. In conventional cases, only the main heater is used or the main heater and the bottom heater are used, therefore, following the enlargement of the sizes of single-crystal silicon ingots and the increasing of volumes of the quartz crucibles, the heat loads on the quartz crucibles grow. This accelerates the deterioration of the quartz crucibles. Furthermore, fragments of $SiO_2$ segregated from the surface of the quartz crucible are captured into single-crystal silicon and subsequently polycrystallize, hence, in the case of B, the single crystallization ratio dropped to a value of 43%, in the case of C, single crystallization ratio dropped to a value of 57%. However, compared with conventional cases, the heat load in this invention on the quartz crucible was extremely low, consequently it was difficult to polycrystallize, and the single crystallization ratio was 80%.

Next, in the experiments concerning recharging material, an apparatus with the same structure as shown in FIG. 13 was used, and polycrystalline silicon of 120 kg weight was fed into a 24-inch quartz crucible to pull up an 8-inch single crystal silicon of 70 kg weight, then polycrystalline silicon rod of substantially 70 kg kg weight was further fed into the 24-inch quartz crucible and was heated. The added material as above was heated into melt so that a level of the melt surface is as a predetermined level after being recharged and a second single-crystal silicon was pulled up from the recharged melt. On this occasion, the main heater 6 and the top heater 13 were used.

For comparison, two conventional cases, only the main heater 6 and the main heater 6 combined with the bottom heater 20, were utilized to melt material. The electrical power inputted into each heater during the melting of recharged material is shown in Table two.

TABLE TWO

| | Electrical power inputted into the heaters (KW) | | | | |
|---|---|---|---|---|---|
| | The invention | | Conventional case-1 | Conventional case-2 | |
| Process | Main heater | Top heater | Main heater only | Main heater | Bottom heater |
| Melting material | 125 | 45 | 170 | 125 | 45 |

In the experiments according to this invention, two single-crystal silicon ingots were obtained. When utilizing the conventional art, the deterioration of the quartz crucible was extraordinary, and two single-crystal silicon ingots were polycrystallized during the process of pulling up.

As described above, in the process of manufacturing single-crystal silicon using the CZ method or MCZ method according to this invention, a top heater is provided above the quartz crucible and the outputs of the main heater and the top heater are controlled to pull up single-crystal silicon. The heat load on the quartz crucible in the process of this invention is less than that in the processes of conventional cases in which only main heaters or main heaters in combination with bottom heaters are used. By this, the amount of oxygen dissolved in the melt is reduced, and single crystals with low oxygen density or extremely low oxygen density can be obtained. In addition, the deterioration of the quartz crucible can be slowed down, consequently the single crystallization is thus enhanced.

The method and apparatus for manufacturing single crystals according to this invention can give the best effect to large-diameter single-crystal silicon ingots, especially those with diameters larger than 12 inches.

What is claimed is:

1. An apparatus for manufacturing sinzle-crystal silicon by a Czochralski (CZ) technique, comprising:
   a quartz crucible being filled with polycrystalline silicon as a raw material;
   a main heater for melting a raw material into melt and heating the melt, surrounding the quartz crucible:
   a top heater disposed above the quartz crucible; and
   a pulling up means for pulling up a single crystal silicon from the melt, wherein the top heater is provided with at lease one of the following functions:
   (a) rectifying carrier gases;
   (b) heating the material fed into the quartz crucible and the melt;
   (c) heating the single-crystal silicon being pulled up;
   (d) reducing an amount of oxygen dissolved into the melt from the quartz crucible and the deterioration of the quartz crucible induced by heat load; and (e) giving thermal history to the single-crystal silicon pulled up from the melt wherein the top heater is a truncated cone opened at its two ends or a heater provided with one- or multiple-stage cylinders.

2. The apparatus for manufacturing single-crystal silicon as claimed in claim 1, wherein at least the surfaces of the top heater, facing the melt are covered by reflection plates.

3. An apparatus for manufacturing single-crystal silicon by a CZ technique, comprising a quartz crucible being filled with polycrystalline silicon as a raw material;

a main heater for melting a raw material into melt and heating the melt, surrounding the quartz crucible;

a top heater disposed above the quartz crucible; and a pulling up means for pulling up a single crystal silicon from the melt, wherein the top heater is provided with at lease one of the following functions:
 (a) rectifying carrier gases;
 (b) heating the material fed into the quartz crucible and the melt;
 (c) heatino the single-crystal silicon being pulled up;
 (d) reducing an amount of oxygen dissolved into the melt from the quartz crucible and the deterioration of the quartz crucible induced by heat load; and
 (e) giving thermal history to the single-crystal silicon pulled up from the melt
 wherein the top heater is disposed adjacent to the lower end of the cylindrical or reverse-frustrated con-shaped rectifying cylinder.

4. An apparatus for manufacturing single-crystal silicon by a CZ technique, comprising:

a quartz crucible being filled with polycrystalline silicon as a raw material;

a main heater for melting a raw material into melt and heating the melt, surrounding the quartz crucible;

a top heater disposed above the quartz crucible; and a plulling up means for pulling up a single crystal silicon from the melt, wherein the top heater is provided with at lease one of the following functions:
 (a) rectifying carrier gases;
 (b) heating the material fed into the quartz crucible and the melt;
 (c) heating the single-crystal silicon being pulled up;
 (d) reducing an amount of oxygen dissolved into the melt from the quartz crucible and the deterioration of the quartz crucible induced by heat load; and
 (e) giving thermal history to the single-crystal silicon pulled up from the melt wherein a means for applying a horizontal magnetic field, comprising two coils disposed vertically sandwich the main heater, is provided.

5. An apparatus for manufacturing single-crystal silicon by a CZ technique, comprising:

a quartz crucible being filled with polycrystalline silicon as a raw material;

a main heater for melting a raw material into melt and heating the melt, surrounding the quartz crucible;

a top heater disposed above the quartz crucible; and a pulling up means for pulling up a single crystal silicon from the melt, wherein the top heater is provided with at lease one of the following functions:
 (a) rectifying carrier gases;
 (b) heating the material fed into the quartz crucible and the melt;
 (c) heating the single-crystal silicon being pulled up;
 (d) reducing an amount of oxygen dissolved into the melt from the quartz crucible and the deterioration of the quartz crucible induced by heat load; and
 (e) giving thermal history to the single-crystal silicon pulled up from the melt,
 wherein a means for applying a cusp magnetic field, comprising a ring-shaped upper coil and a ring-shaped lower coil disposed around the main heater, is provided.

* * * * *